(12) United States Patent
Lethellier

(10) Patent No.: US 9,529,372 B2
(45) Date of Patent: Dec. 27, 2016

(54) FAULT-REJECTING MIXER AND APPLICATIONS

(71) Applicant: Volterra Semiconductor Corporation, Fremont, CA (US)

(72) Inventor: Patrice Lethellier, Sunnyvale, CA (US)

(73) Assignee: Volterra Semiconductor Corporation, Fremont, CA (US)

( * ) Notice: Subject to any disclaimer, the term of this patent is extended or adjusted under 35 U.S.C. 154(b) by 1087 days.

(21) Appl. No.: 13/669,807

(22) Filed: Nov. 6, 2012

(65) Prior Publication Data

US 2014/0125298 A1    May 8, 2014

(51) Int. Cl.
*H03K 3/00* (2006.01)
*G05F 1/46* (2006.01)
*H03D 7/12* (2006.01)
*H03D 7/16* (2006.01)

(52) U.S. Cl.
CPC ............... *G05F 1/46* (2013.01); *H03D 7/125* (2013.01); *H03D 7/165* (2013.01); *H03D 2200/0074* (2013.01)

(58) Field of Classification Search
CPC .......... H03K 17/693; H02M 7/493; H02J 1/10
USPC ............... 323/233, 234, 282, 284, 286, 288, 272,323/290; 327/307, 427; 307/29, 44, 53, 65, 64, 307/87
See application file for complete search history.

(56) References Cited

U.S. PATENT DOCUMENTS

| | | | | |
|---|---|---|---|---|
| 5,570,061 A * | 10/1996 | Shimoda | ................... | G05F 1/59 327/332 |
| 6,995,599 B2 * | 2/2006 | Huang | ..................... | H02J 1/10 327/408 |
| 7,746,154 B2 * | 6/2010 | Merandat | ............. | H03K 17/005 327/407 |
| 8,049,368 B2 * | 11/2011 | Miyazaki | .................. | G05F 1/56 307/70 |
| 8,754,542 B2 * | 6/2014 | Gammel | .................. | H02J 4/00 307/31 |

* cited by examiner

*Primary Examiner* — Rajnikant Patel
(74) *Attorney, Agent, or Firm* — Weaver Austin Villeneuve & Sampson LLP

(57) ABSTRACT

Mixers are described which allow for information sharing in redundant systems, while providing sufficient isolation between redundant system components to enable fault-tolerant operation.

24 Claims, 13 Drawing Sheets

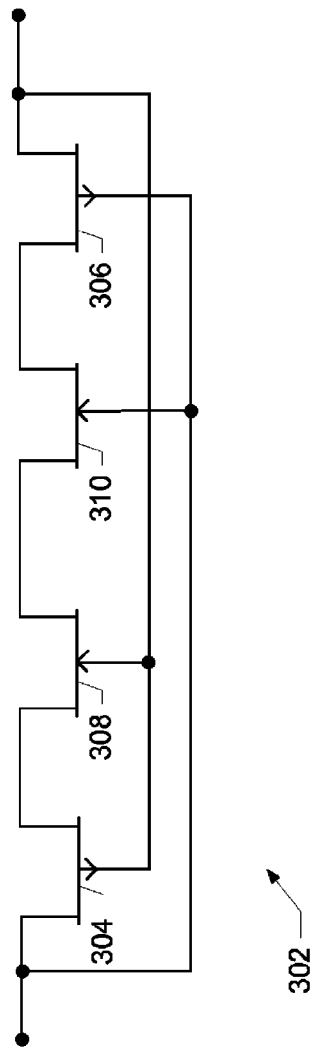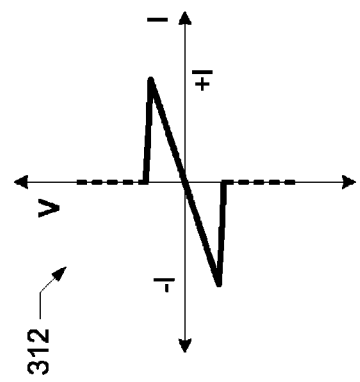
FIG. 3

1

FAULT-REJECTING MIXER AND APPLICATIONS

BACKGROUND OF THE INVENTION

The present invention relates to fault-rejecting mixers as well as applications of fault-rejecting mixers to enable fault-tolerant and/or redundant systems.

Designers of electronic systems often introduce redundancies for a variety of purposes, e.g., fault tolerance, load sharing, etc. From the perspective of fault tolerance, it is desirable that the operation of redundant system components be isolated from each other. However, such isolation may be undesirable for other design goals.

For example, in the context of voltage regulator design, multiple voltage regulators may be operated in parallel to share the burden of delivering current to a common load, as well as reduce output ripple current. To achieve these design goals, some amount of information may need to be shared among the parallel regulators. However, conventional mechanisms for sharing such information typically introduce a "single point of failure" (SPOF) into the system, defeating the goal of fault tolerance.

SUMMARY OF THE INVENTION

According to a first class of implementations, a fault-rejecting mixer includes a plurality of bidirectional isolators, each of which has a first terminal and a second terminal. The first terminals of all of the bidirectional isolators are coupled to a common node of the fault-rejecting mixer. The second terminal of each of the bidirectional isolators is configured to transmit a corresponding system signal to or from a system environment. The bidirectional isolators are configured such that a mixer signal at the common node substantially corresponds to a combination of all of the system signals within a valid range. The bidirectional isolators are further configured such that contribution to the mixer signal from any of the system signals outside of the valid range is substantially rejected.

According to some implementations, the combination of the system signals within the valid range substantially corresponds to one of (1) an average of the system signals within the valid range, (2) a scaled average of the system signals within the valid range, or (3) an average of the system signals within the valid range with an added offset.

According to some implementations, the bidirectional isolators are configured such that operation of the fault-rejecting mixer does not require a bias voltage from the system environment.

According to some implementations, each of the bidirectional isolators is configured to generate a substantially constant positive current or a substantially constant negative current when the corresponding system signal is outside of the valid range.

According to some implementations, each of the bidirectional isolators is configured to appear as a substantially open circuit when the corresponding system signal is outside of the valid range.

According to some implementations, each of the bidirectional isolators is configured to generate substantially no current when the corresponding system signal is outside of the valid range.

According to some implementations, each of the bidirectional isolators includes a plurality of transistors coupled in series. According to some implementations, each of the bidirectional isolators includes two n-channel depletion-mode transistors with source terminals connected. According to some of these implementations, each of the bidirectional isolators further includes two p-channel transistors, each p-channel transistor being connected in series with a drain terminal of one of the n-channel depletion-mode transistors.

According to another class of implementations, a circuit is configured to connect X system components to Y system components in a system environment, and to substantially isolate each of the X and Y system components from faults associated with any other of the X and Y system components; X and Y both being integers greater than one. The circuit includes two fault-rejecting mixers that share a common node.

According to another class of implementations, a DC to DC converter includes a plurality of converter blocks configured in parallel. Each of the converter blocks includes a negative feedback loop configured to limit the gain of the converter block using a feedback signal of the converter block, thereby determining a corresponding load line for the converter block. The respective load lines of the plurality of converter blocks have substantially the same slope, and the slopes of the load lines are sufficient to enable a predetermined level of current sharing among the converter blocks. The DC to DC converter further includes a mixer configured to generate a mixer signal that substantially corresponds to a combination of at least some of the feedback signals, and to transmit the mixer signal to each of the converter blocks as positive feedback, thereby determining a system level load line for the DC to DC converter having a slope that is less than the slopes of the converter blocks.

According to another class of implementations, a DC to DC converter includes a plurality of parallel phases, each of which includes switching circuitry configured to define a conduction interval. The DC to DC converter further includes a mixer configured to receive a frequency synchronization signal from each of the parallel phases representing a frequency and phase of operation of the corresponding phase. The mixer is configured to generate a mixer signal that substantially corresponds to a combination of at least some of the frequency synchronization signals. Each of the parallel phases further includes control circuitry configured to control the frequency and phase of operation of the corresponding phase using the corresponding frequency synchronization signal as feedback. The frequency synchronization signal of each phase varies with the mixer signal such that the conduction intervals of the respective parallel phases are substantially evenly distributed over 360 degrees of phase.

According to another class of implementations, a DC to DC converter includes a plurality of converter blocks configured in parallel. A plurality of master blocks are configured to effect redundant control of the plurality of converter blocks. The DC to DC converter further includes a first fault-rejecting mixer that includes a plurality of bidirectional isolators, each of which has a first terminal and a second terminal. The first terminals of all of the bidirectional isolators are coupled to a common node of the first fault-rejecting mixer. The second terminal of each of the bidirectional isolators is configured to receive a control signal from a corresponding one of the master blocks. The bidirectional isolators are configured such that a mixer signal at the common node substantially corresponds to a combination of all of the control signals within a first valid range. The bidirectional isolators are further configured such that contribution to the mixer signal from any of the control signals outside of the first valid range is substantially rejected. The mixer signal is provided to the parallel converter blocks via the common node of the first fault-rejecting mixer.

According to another class of implementations, a system includes X system components, where X is an integer greater than one, and a first fault-rejecting mixer comprising a first plurality of bidirectional isolators. Each of the first plurality of bidirectional isolators has a first terminal and a second terminal. The first terminals of all of the first plurality of bidirectional isolators are coupled to a first common node. The second terminal of each of the first plurality of bidirectional isolators is configured to transmit a corresponding system signal to or from a corresponding one of the X system components. The first plurality of bidirectional isolators are configured such that a first mixer signal at the first common node substantially corresponds to a combination of all of the system signals corresponding to the X system components within a first valid range. The first plurality of bidirectional isolators are further configured such that contribution to the first mixer signal from any of the system signals corresponding to the X system components outside of the first valid range is substantially rejected.

A further understanding of the nature and advantages of the present invention may be realized by reference to the remaining portions of the specification and the drawings.

BRIEF DESCRIPTION OF THE DRAWINGS

FIG. 3 illustrates examples of the implementation and operation of another FRM.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, specific details are set forth in order to provide a thorough understanding of the present invention. The present invention may be practiced without some or all of these specific details. In addition, well known features may not have been described in detail to avoid unnecessarily obscuring the invention.

Mixers are described herein which allow for information sharing in redundant systems, while providing sufficient isolation between redundant system components to enable fault tolerant operation. These mixers are configured to generate a combination of valid inputs (i.e., inputs within a certain range), while substantially rejecting invalid inputs. And as will be discussed, because at least some implementations of these mixers employ depletion-mode devices and do not therefore require a bias voltage from the system for operation, they are significantly less vulnerable as a "single point of failure" (SPOF).

Also described are applications of such mixers in the context of redundant voltage regulators, e.g., DC to DC converters having multiple parallel branches. However, it should be understood that the mixers described herein are much more generally applicable, enabling fault-tolerant operation and system redundancy in a wide variety of contexts. The scope of the invention should therefore not be limited with reference to specific applications described herein.

Figure 1:
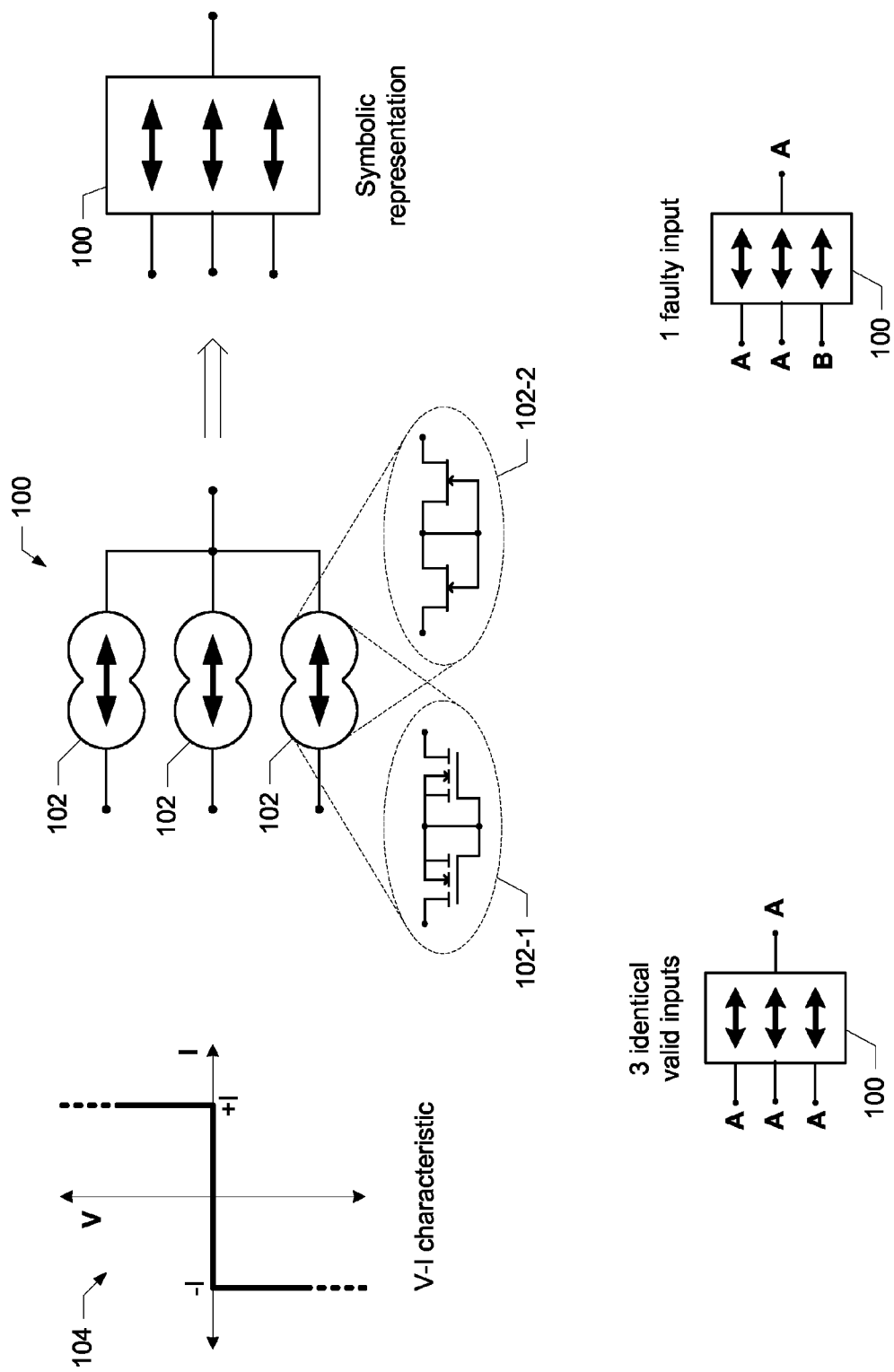
FIG. 1 illustrates examples of the implementation and operation of a fault-rejecting mixer (FRM).

Operation of an example of a fault-rejecting mixer (FRM) 100 will be described with reference to FIG. 1. Mixer 100 is constructed by configuring multiple bidirectional isolators (in this example bidirectional current sources 102) in parallel, each receiving an input on the left hand terminal and connecting with the other current sources at a common output node on the right hand terminal. In this example, three bidirectional isolator branches are shown for the purpose of discussion. However, it should be noted that mixers as described herein may be implemented with an arbitrary number of branches and bidirectional isolators in parallel. It should also be noted that, as discussed below with reference to further implementations, other types of bidirectional isolators in addition to bidirectional current sources may be employed.

According to various implementations, the bidirectional isolators are configured such that a mixer signal at the common node of the FRM substantially corresponds to a combination of all of the input signals that are within a valid range. Contribution to the mixer signal from any of the input signals that are outside of the valid range is substantially rejected.

According to some implementations, the nature of the combination of the input signals may vary. For example, the mixer signal might be an average of the input signals within the valid range. Alternatively, the mixer signal might be a scaled average of the input signals within the valid range, or an average of the input signals within the valid range with an added offset. Other suitable variations will be appreciated by those of skill in the art.

An ideal representation of the V-I characteristic (104) of one bidirectional current source 102 from the depicted implementation is shown. Mixer 100 is constructed such that, if all of the bidirectional current sources receive substantially identical input voltages A, the output of mixer 100 will be an average of the inputs; also substantially A (lower left hand diagram). On the other hand, if any one of the current sources receives an input voltage B that is significantly different from A (e.g., a short to a bias voltage or ground), the resistance (V/I) of that branch increases dramatically (effectively an open circuit), reducing the contribution to the output from that branch, thus isolating the output from the fault, i.e., the output will still be substantially A (lower right hand diagram).

According to a particular class of implementations, two n-channel depletion-mode transistors (e.g., MOSFETs (102-1) or JFETs (102-2)) are connected to implement bidirectional current sources 102. As shown in FIG. 1, this may be achieved by connecting the gate and source terminals of the two devices together. Alternative configurations may also be used to achieve similar functionality. Because each of the transistors shown in FIG. 1 is a depletion-mode device, a positive voltage from the drain terminal to the source terminal of either device will result in a current (limited at I or −I) through both devices, the direction of which depends on which device is experiencing the positive drain-to-source voltage. The output of a mixer constructed from such bidirectional current sources is substantially an average of the inputs with a contribution from any one of the inputs being significantly reduced where that input is outside valid limits.

And because, in this example, neither device of bidirectional current sources 102 on which mixer 100 is based relies on the use of a bias voltage from the surrounding system for operation, the mixer is not vulnerable to short circuits to these bias voltages, and therefore reducing the potential for mixer 100 to act as a SPOF.

Figure 2:
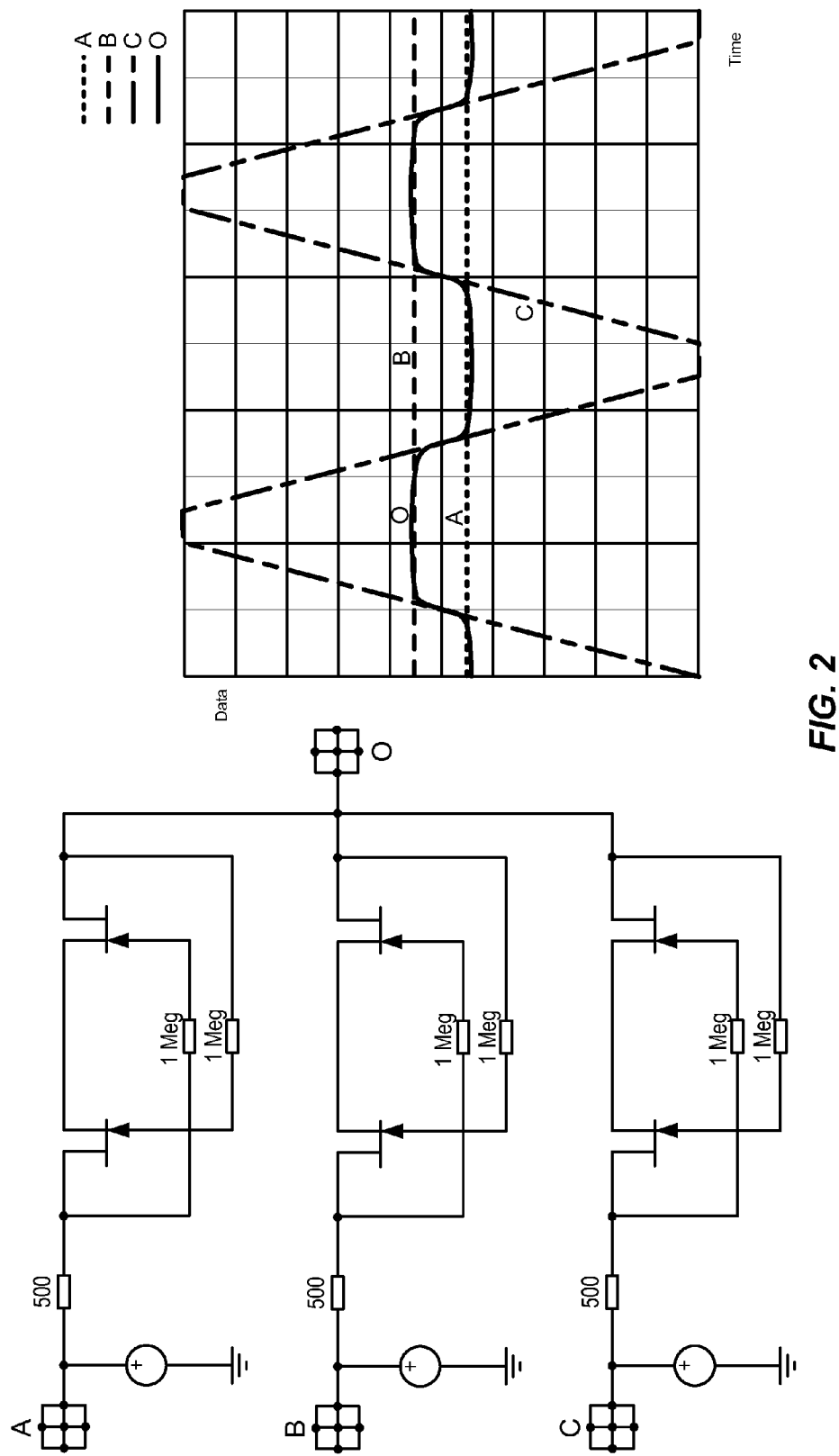
FIG. 2 provides a more detailed schematic of a particular implementation of an FRM along with simulation results illustrating operation of the FRM.

Another schematic of a fault-rejecting mixer including three bidirectional isolators implemented with bidirectional current sources similar to current sources 102 is shown in FIG. 2. Again, it should be noted that the number of current sources shown is merely by way of example, and that an arbitrary number may be employed to implement fault-rejecting mixers suitable for particular applications. Also included in FIG. 2 are simulation results showing the averaging of mixer input voltages A, B and C, with the contribution to the mixer output O from input C being deemphasized, i.e., rejected, by operation of the mixer. As will be understood with reference to these simulation results, the actual V-I characteristic of each of current sources 102 does not conform to the ideal representation shown in FIG. 1. Instead, there is a sloped line between currents I and −I passing through the origin representing the actual V-I characteristic (for Vgs=0) for each of the devices.

According to another class of implementations, fault-rejecting mixers are implemented with bidirectional isolators which "snap off" in response to an invalid input, i.e., the current through the bidirectional isolator goes to zero or near zero to effect a substantially complete disconnect, therefore isolating the invalid input from the valid ones. An example of an implementation of such a bidirectional isolator 302 is illustrated in FIG. 3 in which two p-channel devices 304 and 306 are connected with two n-channel depletion-mode devices 308 and 310. In this example, JFETs are shown, but MOSFETs or other suitable devices may also be used, as well as combinations of different types of devices.

For valid inputs, the depletion-mode devices of bidirectional isolator 302 operate similar to the depletion-mode devices of current sources 102. However, when voltage across either of the p-channel devices becomes sufficiently large, e.g., in response to an invalid input, it stops conducting and bidirectional isolator 302 "snaps off" as shown in V-I characteristic 312. Again, it should be noted that because no bias voltages from the surrounding system are employed in this implementation, a mixer constructed from a plurality of bidirectional isolators 302 is significantly less vulnerable to being a SPOF.

It should also be noted that the implementation of bidirectional isolator 302 shown in FIG. 3 is merely one example of how the "snap off" functionality illustrated in V-I characteristic 312 may be achieved. That is, those of skill in the art will understand how to connect an n-channel device with a p-channel device to achieve such a snap off characteristic, at least in one direction of the V-I characteristic. By then combining such a configuration with a "mirror image" configuration that achieves a similar snap off in the other direction, a bidirectional isolator may be constructed for use in implementing a mixer as described herein. The scope of the invention should therefore not be limited to the particular bidirectional isolator topologies shown.

Figure 4:
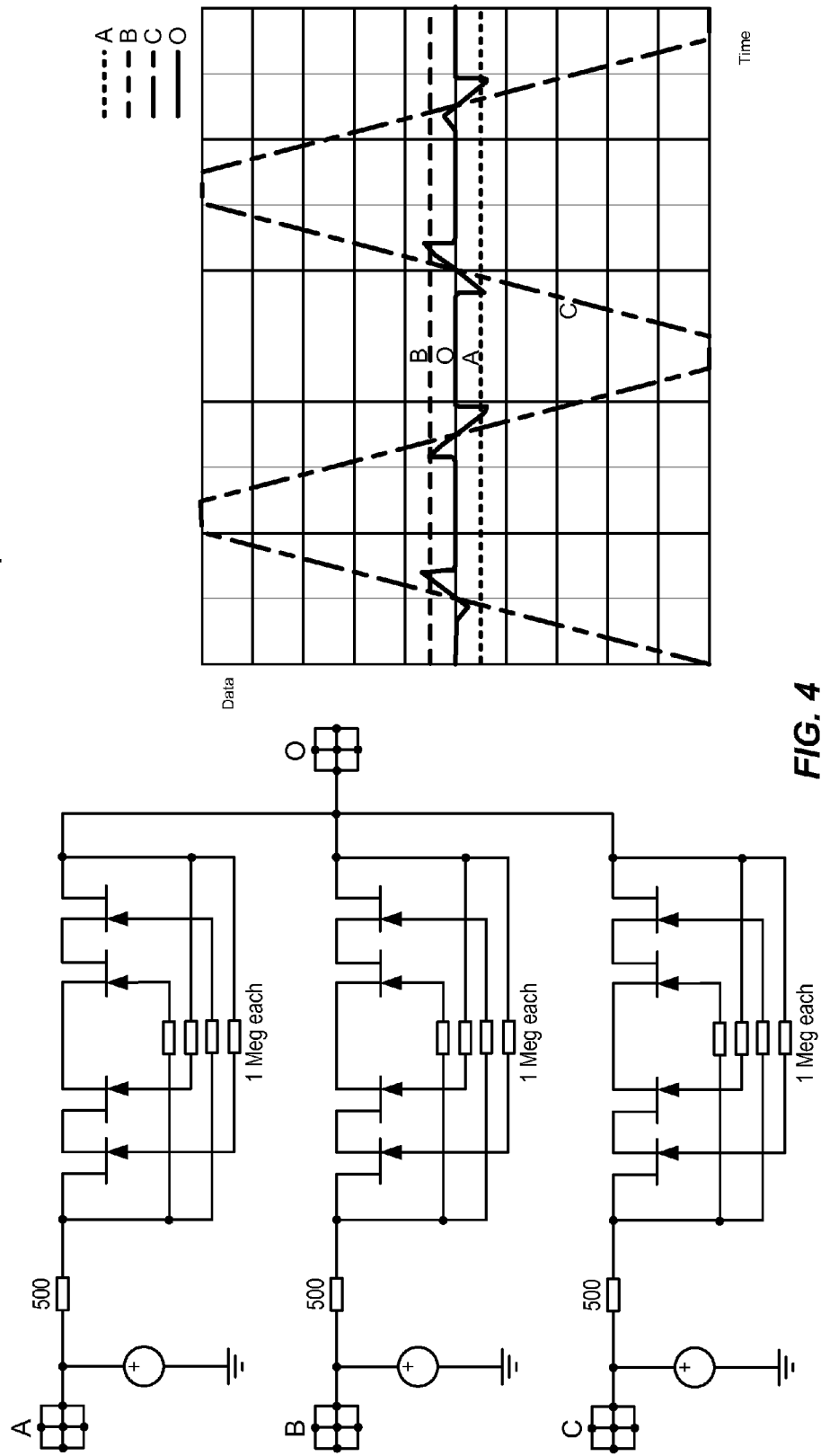
FIG. 4 provides a more detailed schematic of another particular implementation of an FRM along with simulation results illustrating operation of the FRM.

A more detailed schematic of a fault-rejecting mixer including three bidirectional isolators similar to bidirectional isolators 302 is shown in FIG. 4. Again, it should be noted that the number of bidirectional isolators shown is merely by way of example, and that an arbitrary number may be employed. Also included in FIG. 4 are simulation results showing the averaging of mixer input voltages A, B and C. As can be seen relative to the simulation results shown in FIG. 2, the "snap off" characteristic of the bidirectional isolator receiving input C even further deemphasizes that bidirectional isolator's contribution to mixer output O; making its contribution effectively zero when that input is outside of the valid range.

Implementing the bidirectional isolators of a fault-rejecting mixer on a single semiconductor die can serve to ensure that the V-I characteristics of the bidirectional isolators are sufficiently well matched to ensure optimal mixer operation. Alternatively, for mixers constructed from discrete components, special care should be taken to screen mixer components for matching characteristics. In addition, it should be noted that the inputs received by these mixers can be digital or analog with fault rejection working in both domains. Still more generally, fault-rejecting mixers implemented as described herein may be used to mix information and/or reject faults without introducing a SPOF in any type of system in which such functionalities are desirable.

Specific implementations will now be discussed in the context of voltage regulation and power systems. In particular, DC to DC converters having multiple parallel phases will be discussed. However, as discussed above, the scope of the invention should not be limited to regulator applications or the specific regulator types or topologies discussed.

Voltage regulators and other power supplies, such as direct current (DC) to DC converters, are used to provide stable voltage or current sources for electronic devices and systems. The typical purpose of a voltage regulator is to convert a source voltage, such as the voltage of an alternating current (AC) or DC power source, into one or more operating DC voltages of an electronic device. Switching voltage regulators, often referred to as "switching regulators," are a type of DC to DC converter that converts one DC voltage to another DC voltage with high efficiency. A switching regulator generates an output voltage by converting an input DC voltage into, for example, a square wave, and filtering the converted voltage to produce the output DC voltage.

Switching regulators typically include a switch for alternately coupling and decoupling an input DC voltage source (which may or may not be unregulated), such as a battery, to a load, such as an integrated circuit. An output filter, typically including an inductor and a capacitor, is coupled between the switch and the load to filter the output of the switch and thus provide the output DC voltage. Such DC to DC converters operate on the principle of storing energy in the inductor during one portion of a cycle and then transferring the stored energy to the capacitor and the load in the next portion of the cycle. The output filter serves to attenuate ripple at the output. DC to DC converters may employ a variety of topologies such as, for example, a Buck topology, a boost topology, a Buck-boost topology, or an isolated topology.

For applications in which large currents are required, it may be useful to have two or more DC to DC converter power stages in parallel to distribute the current load. Such redundancy may also be valuable from the perspective of fault tolerance. The operation of these converters would typically be "interleaved" such that their respective switching waveforms are out of phase with each other by 360/N degrees, i.e., substantially evenly distributed over 360 degrees of phase, where N is the number of parallel converters. For this reason, the parallel interleaved converters are often referred to as "phases" of the overall power system. For example, where there are two phases in parallel, the phases operate 180 degrees out of phase with each other; for three, 120 degrees; and so on. One of the reasons for this may be understood with reference to FIG. 5.

Figure 5:
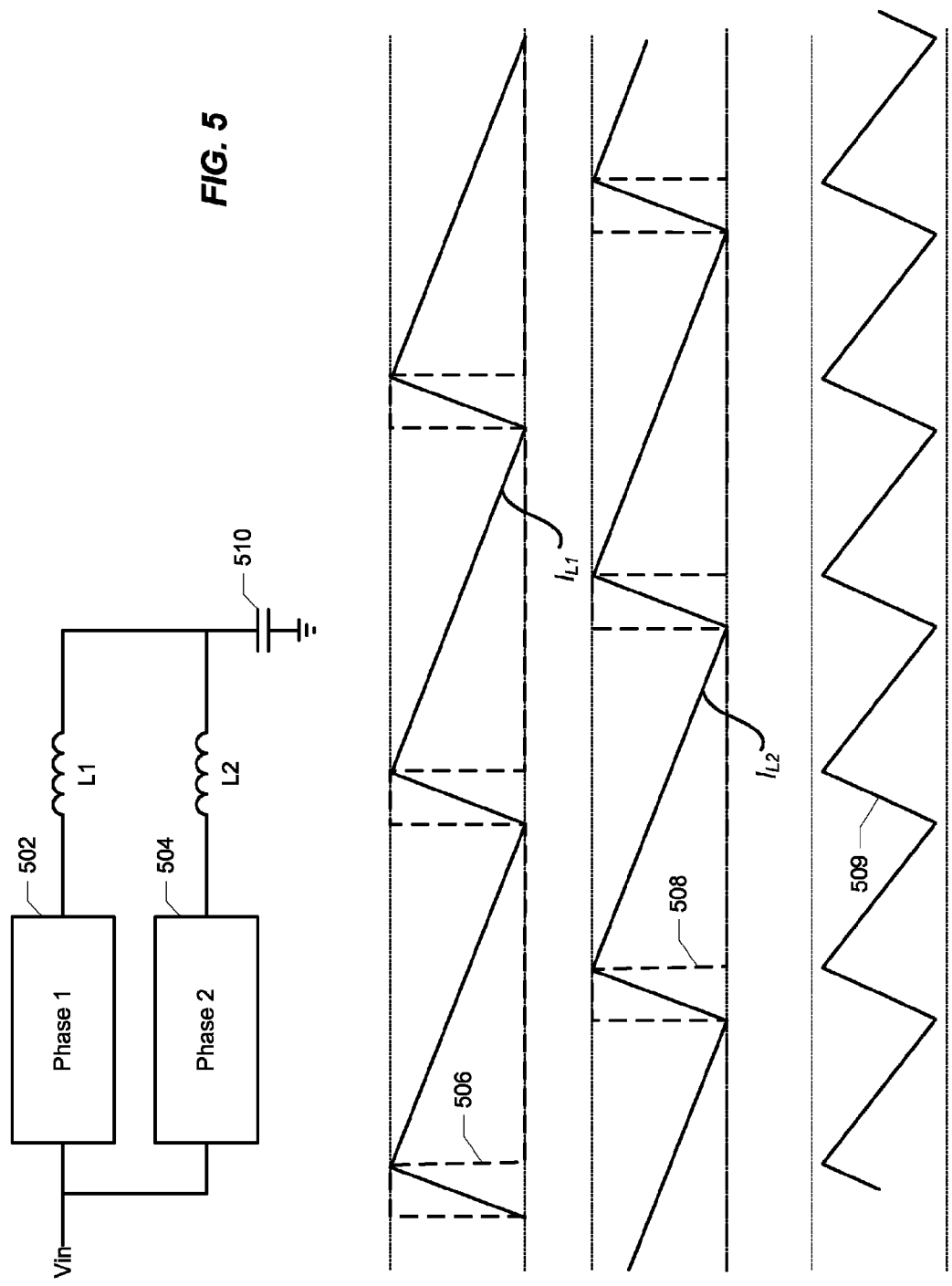
FIG. 5 includes a simplified representation of a DC to DC converter with two phases configured in parallel along with representations of waveforms associated with each.

FIG. 5 shows the inductor current waveforms IL1 and IL2 for two parallel phases (502 and 504 with inductors L1 and L2, respectively) superimposed over the input switching waveforms for each (waveforms are not to scale). The input switching waveforms 506 and 508 illustrate the respective duty cycles for two phases, i.e., the proportion of each cycle during which the input voltage Vin is connected to the load by that phase's power switch. As can be seen, the waveforms for the respective phases are 180 degrees out of phase with each other with the inductor currents IL1 and IL2 being represented by saw-tooth waveforms having a substantially similar phase relationship. As indicated by combined ripple waveform 509, when the two inductor currents are summed at output capacitor 510, the resulting output current ripple waveform has about twice the frequency and is smaller peak-to-peak than the respective inductor currents. This results in a smaller output voltage ripple than if only one phase was used or if two phases were used but did not have the phase relationship shown.

In the case of two interleaved phases as shown in FIG. 5, a 2:1 conversion ratio (i.e., Vout=Vin/2) is advantageous in that it results in a pair of substantially symmetric output ripple waveforms. Under ideal conditions, this symmetry would result in perfect ripple cancellation at the output capacitor as the two symmetric ripple waveforms are 180 degrees out of phase with each other. A similar ripple cancellation effect may be achieved for a 3:1 or 3:2 conversion ratio using three interleaved phases; for a 4:1, 4:2 or 4:3 conversion ratio using four interleaved phases, and so on. More generally, the ideal case of zero current ripple in total output current corresponds to the conversion ratio of N:M, where N is the number of parallel converters and M is an integer 0<M<N. For topologies with a step-up gain, e.g., boost converters, the conversion ratio would be M:N.

Achieving zero or near zero ripple with discrete inductors is potentially beneficial in that it ideally results in little or no ripple current in the output capacitor. Absent other considerations, this means that the output capacitance can be made very small. However, because the ripple cancellation is achieved at the output capacitors while the parallel phases themselves still experience the full current ripple, those phases operate at the same frequency, with the same inductor value, the same current ripple and the same power dissipation as if they were not interleaved. In many applications, output capacitors are sized with respect to design considerations other than output voltage ripple, e.g., load transient tolerance, so the benefit of ripple cancellation in the output capacitors may not result in decreased output capacitance absent other considerations. In addition, parasitic inductance and resistance between the inductors of these parallel phases limit the ripple cancellation that can be achieved in practice.

On the other hand, if the inductors for the parallel phases are magnetically coupled (e.g., by wrapping the windings around the same core, or around cores magnetically coupled to each other), the benefits of ripple cancellation may be extended to the windings and switches. That is, because the inductors are magnetically coupled, a change in current in one of the windings induces a corresponding change in current in the other winding(s). By magnetically coupling the inductors, ripple cancellation (and corresponding reductions in AC conduction losses) is achieved in the inductors, the power switches, layout copper, and any of the converter components instead of just at the output capacitor. This, in turn, allows for the converter switches to be operated at lower frequency and/or lower current ripple and/or smaller inductor value to decrease the power loss, size and/or cost of the converter than is possible without coupling. In such implementations, the coupling is inverse magnetic coupling, i.e., assuming the currents in all phases have the same direction, the magnetic flux from any winding opposes the magnetic flux from any other winding.

From the foregoing description, it is clear that multi-phase DC to DC converter systems may be characterized by significant advantages provided that some level of coordination among the parallel phases occurs. However, as discussed above, conventional mechanisms for sharing information among redundant system components to facilitate such coordination run counter to the goals of redundancy and fault tolerance in that they typically introduce a SPOF.

Therefore multi-phase DC to DC converters are described herein that employ one or more fault-rejecting mixers (FRMs) to facilitating the mixing of information from otherwise independent parallel phases to enhance system performance and significantly reduce the likelihood of a SPOF. It should be noted that the term "phase" is used herein to refer to parallel conversion circuitry that may or may not have the kind of coordination among the parallel circuits to achieve a specific phase relationship, e.g., evenly spread around 360 degrees of phase. Use of the term should therefore not be construed as requiring any such relationship.

Figure 6:
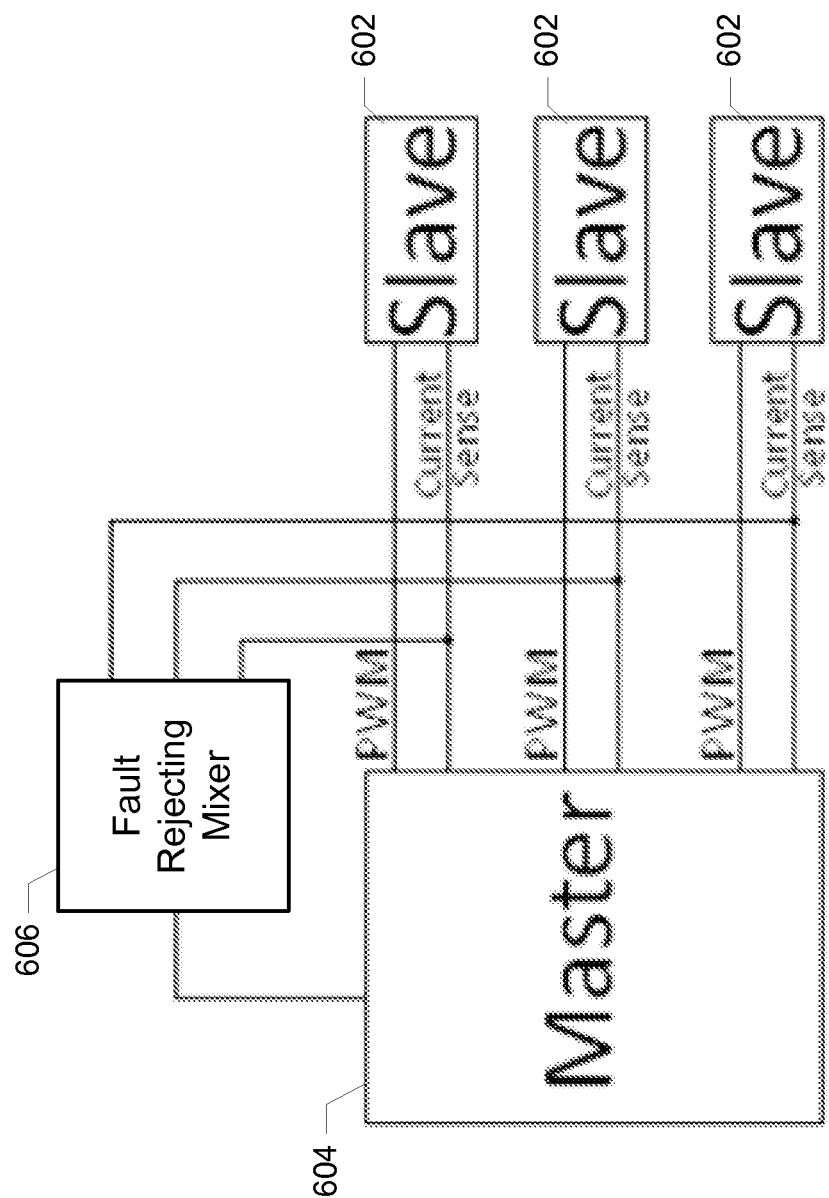
FIG. 6 is a simplified block diagram of a DC to DC converter in which multiple slaves are driven by the same master.

A particular implementation of a multi-phase DC to DC converter 600 is illustrated in the simplified block diagram of FIG. 6 in which multiple slave blocks 602 (e.g., Buck converter power stages) are driven by a single master block 604 (e.g., Buck converter control circuitry). In the depicted implementation (which may be combined with other implementations described herein), current sense feedback is provided to master block 604 via FRM 606. As discussed above, if all of the current sense signals are within a valid range, the output of FRM 606 is a combination, e.g., an average, of these inputs. On the other hand, if any one of slaves 602 fails, i.e., deviates from the valid range, its current sense signal is substantially rejected by FRM 606 and the output of FRM 606 is a combination of the remaining valid inputs.

Figure 7:
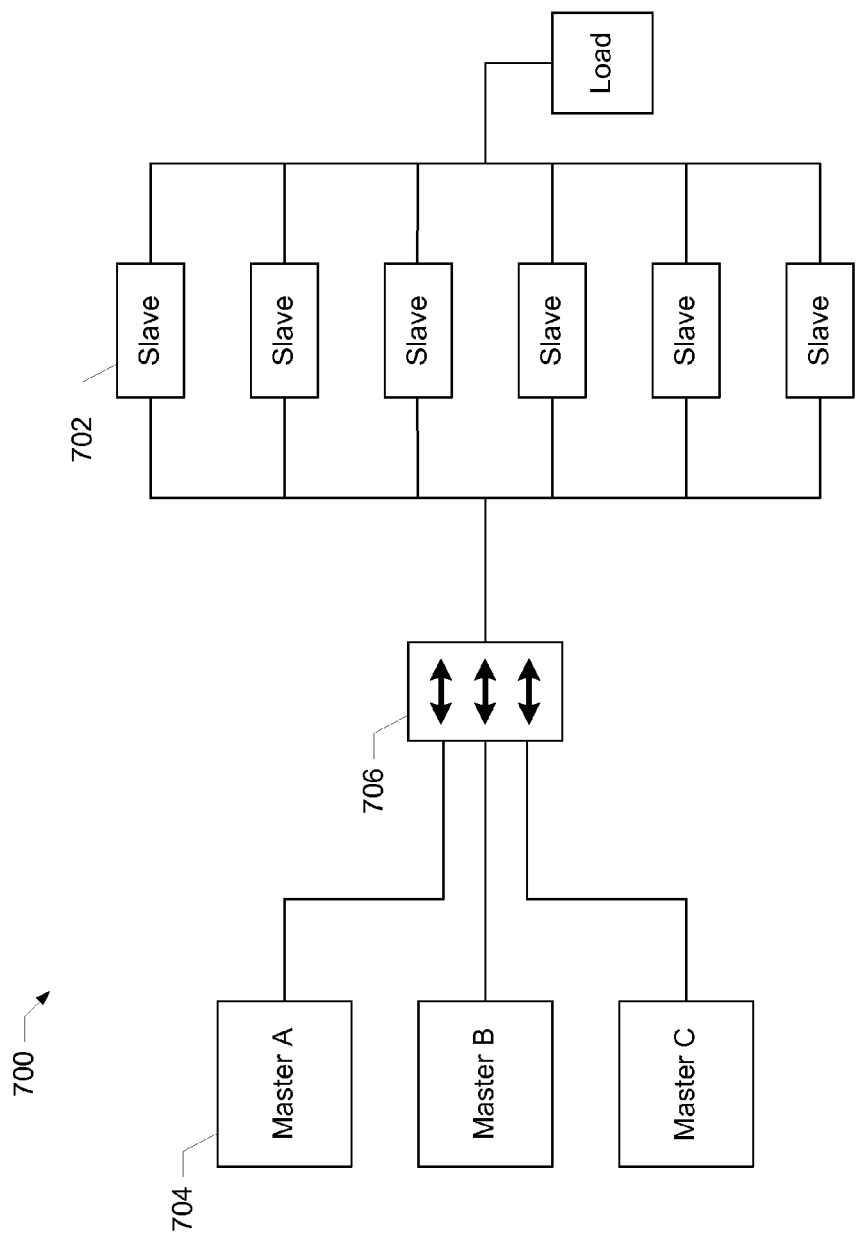
FIG. 7 is a simplified block diagram of a DC to DC converter in which multiple slaves are driven by multiple redundant masters.

FIG. 7 is a simplified block diagram of another multi-phase DC to DC converter 700 in which multiple slave blocks 702 (e.g., Buck converter power stages) are driven by redundant master blocks 704 (e.g., Buck converter control circuitry) via an FRM 706. For simplicity, the feedback from the slaves to the masters is not shown (it should be noted that the feedback to the masters may be provided via an FRM as discussed above with reference to FIG. 6, or any other suitable implementation of an FRM in the feedback path). Again, if all of the masters 704 are generating valid outputs, the output of FRM 706 is an average of these inputs which is distributed to slaves 706. On the other hand, if any one of the masters 704 fails, i.e., its output deviates from the valid range, its output is rejected by FRM 706 and the output of FRM 706 is the average of the remaining valid inputs. Thus, redundancy of the masters is achieved with fault isolation, i.e., low probability of a SPOF.

Current sharing among the parallel phases of a multi-phase DC to DC converter may be achieved through complex communication among the phases. However, conventional approaches to achieving this sharing are not appropriate if the operation of each of the parallel phases is to be independent of the others. One way to achieve a reasonable level of current sharing among independent parallel phases is referred to as passive current sharing and involves configuring all of the phases to operate with load lines that have sufficient slope to ensure that the currents in the individual phases are relatively close. That is, if each of the phases has an associated load line (i.e., a Vout vs. Iout characteristic) with a slope that is substantially the same as the other phases, and each of the phases is configured to regulate a Vout that is substantially the same as the other phases, the differences in Iout between phases will be relatively small.

Figure 8:
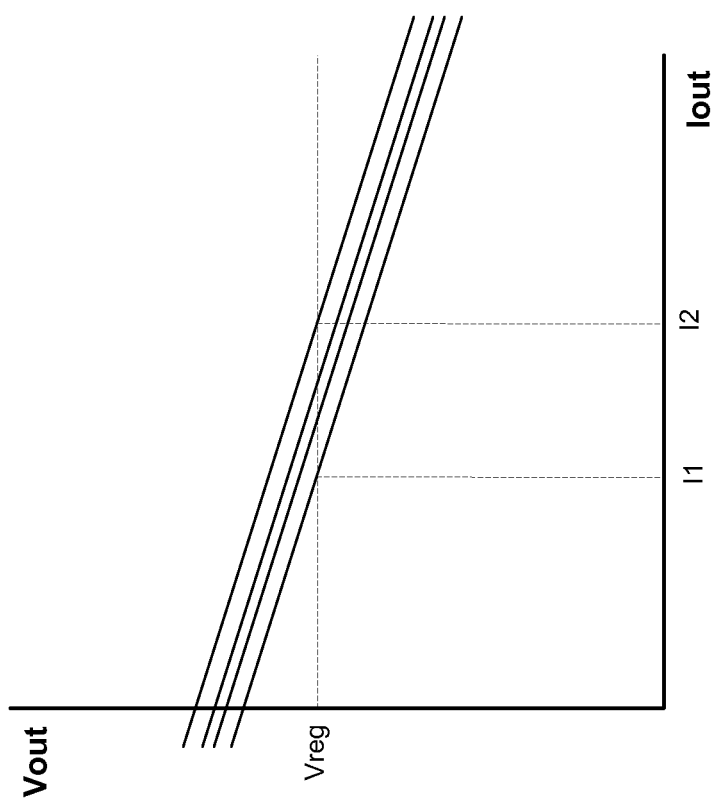
FIG. 8 is a graph illustrating load lines of multiple parallel phases of a DC to DC converter.

Passive current sharing may be understood with reference to FIG. 8 where it is shown that for any regulated voltage Vreg, the output currents for the 4 load lines depicted will stay within a range between I1 and I2. As will be appreciated, the steeper the slopes of the load lines, the smaller the range within which the output currents of the phases will be confined. However, many applications for which multi-phase DC to DC converters are employed require load lines that are extremely shallow (close to zero slope), in which case, passive current sharing is not feasible, i.e., the range of possible output currents for a given Vreg is too great.

Figure 9:
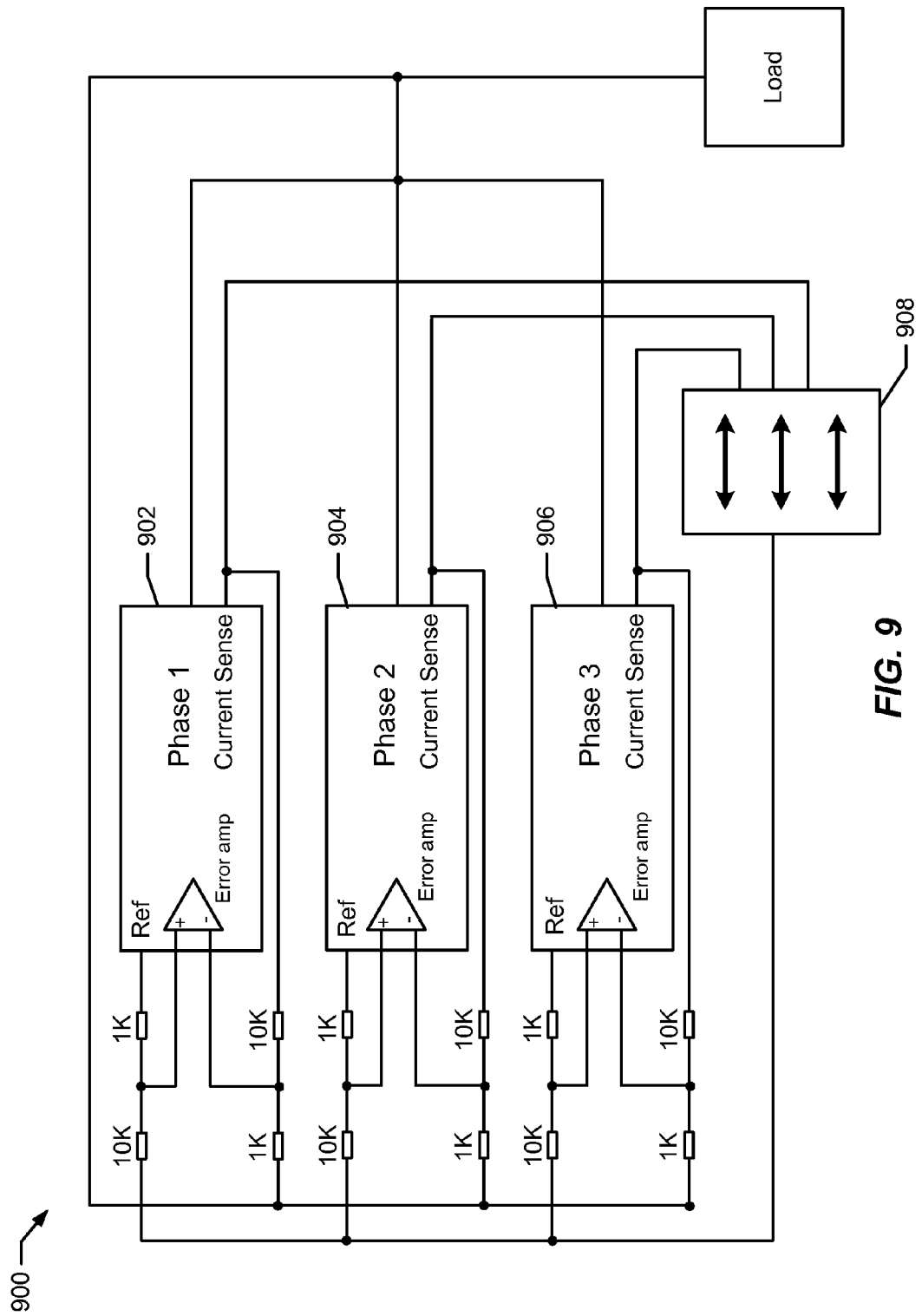
FIG. 9 is a simplified block diagram of a DC to DC converter employing feedback to at least partially cancel load lines of individual parallel phases at the system level.

FIG. 9 shows a multi-phase DC to DC converter 900 that has a very shallow system-level load line while implementing passive current sharing among the parallel phases. This is achieved by configuring each of the parallel phases 902, 904 and 906 with a sufficiently steep load line for a desired level of current sharing for a given output voltage of DC to DC converter 900. Each load line may be set by the introduction of a current component in the voltage loop of each phase, e.g., by introducing a resistance in series with the output of each phase, or by otherwise limiting the DC gain of each phase. In this case, feedback is provided from the current sense output of each phase to the negative feedback input of an error amplifier for that same phase. The load lines of the parallel phases may be made arbitrarily steep with the appropriate slope being determined with reference to the desired level of current sharing for a given application. Those of skill in the art will understand the variety of ways in which the individual load lines may be set.

The load lines of the individual phases are cancelled at the system level by introducing opposing feedback substantially equal in magnitude in each of the phases. As shown in FIG. 9, this may be achieved using an FRM 908 which, as discussed above, achieves the desired goal without the risk of introducing a SPOF associated with alternative approaches. In this example, the output of FRM 908 is substantially an average of the current sense outputs used to determine the individual load lines which is introduced to the positive feedback input of each phase. This feedback has the effect of canceling the overall load line of the multi-phase DC to DC converter at the system level, i.e., at the load. Thus, passive current sharing may be achieved among parallel phases while satisfying system requirements for shallow load lines. And through the use of an FRM, this may be achieved while significantly reducing the likelihood of the introduction of a SPOF.

It should be noted that implementations are contemplated in which FRM 908 is replaced with an averaging circuit that may or may not be fault tolerant. That is, if fault tolerance is not an important design factor, the current sharing described above with reference to FIG. 9 may be achieved without an FRM as described herein. The scope of claims relating to current sharing among parallel phases of a multi-phase DC to DC converter should therefore not necessarily be limited in this respect.

As discussed above, it is desirable with multi-phase DC to DC converters to interleave operation of the parallel phases such that their respective switching waveforms are out of phase with each other by 360/N degrees, i.e., substantially evenly distributed over 360 degrees of phase, where N is the number of parallel phases. This phase relationship among the parallel phases enables ripple cancellation at the output capacitor, the benefits of which may be extended to inductor windings, power switches, layout copper, etc. through the use of coupled inductors. However, some techniques for achieving this synchronization among parallel phases may require communication among the phases and, as a result, introduce a SPOF. However, without some kind of frequency synchronization to achieve ripple cancellation, many applications instead employ a second stage of filtering, or change the filtering by, for example, adding more output capacitance, undesirably increasing system size, complexity and cost.

Figure 10:
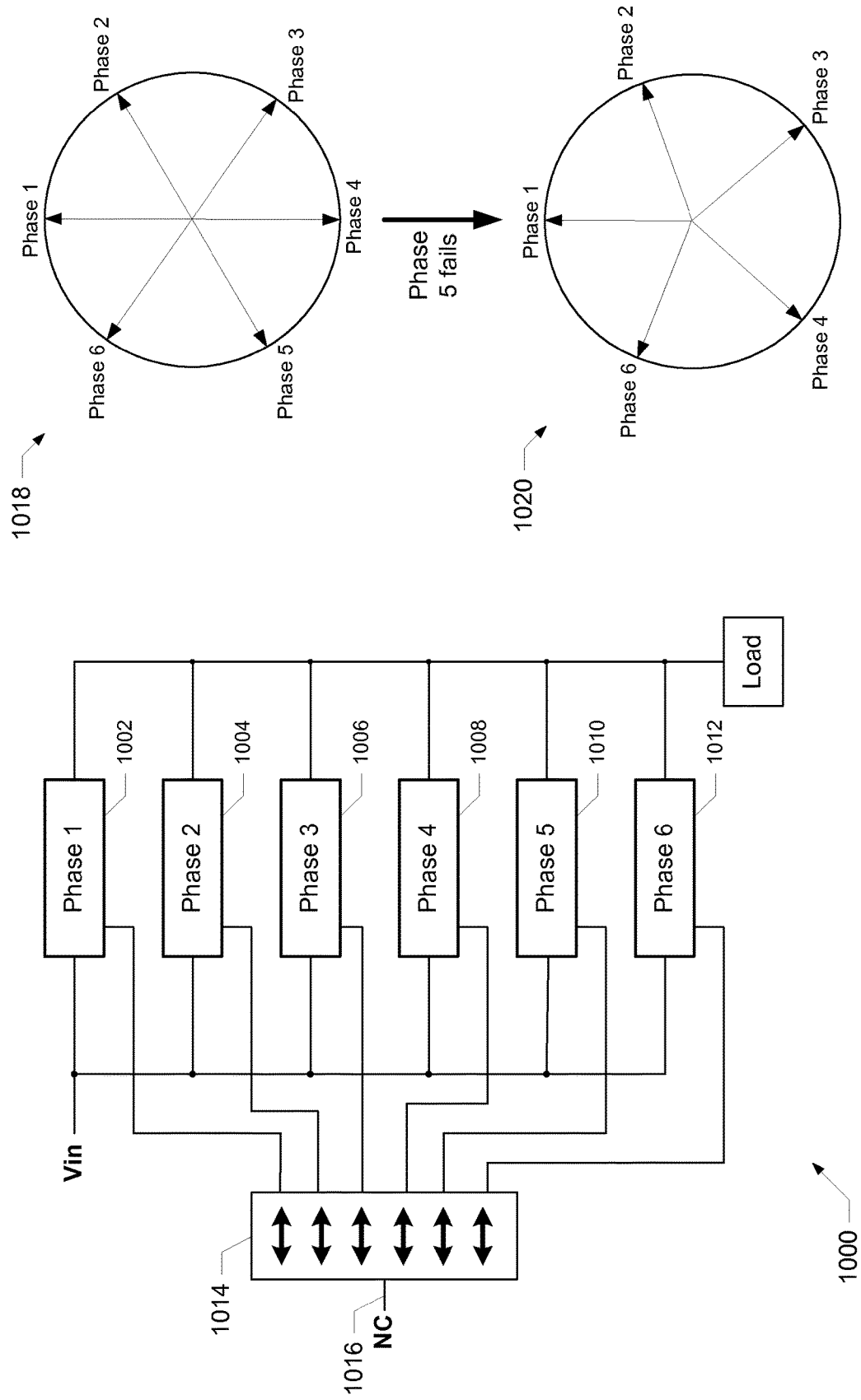
FIG. 10 is a simplified block diagram of a DC to DC converter in which operation of the parallel phases is substantially evenly distributed over 360 degrees of phase.

FIG. 10 shows a multi-phase DC to DC converter 1000 in which the operation of the parallel phases 1002, 1004, 1006, 1008, 1010 and 1012 is interleaved as described above through the use of an FRM 1014. As will be discussed, this approach effectively balances the operation point of each phase against the combination of the other phases. As illustrated by diagram 1018, this has the effect of distributing operation of the 6 phases substantially evenly over 360 degrees of phase (each phase being represented by one of 6 arrows). And because of the fault rejection of FRM 1014, if one of the parallel phases fails, the failure is isolated and operation of the remaining phases is redistributed over the 360 degrees of phase (diagram 1020). The mechanism by which this redistribution occurs is described below.

Figure 11:
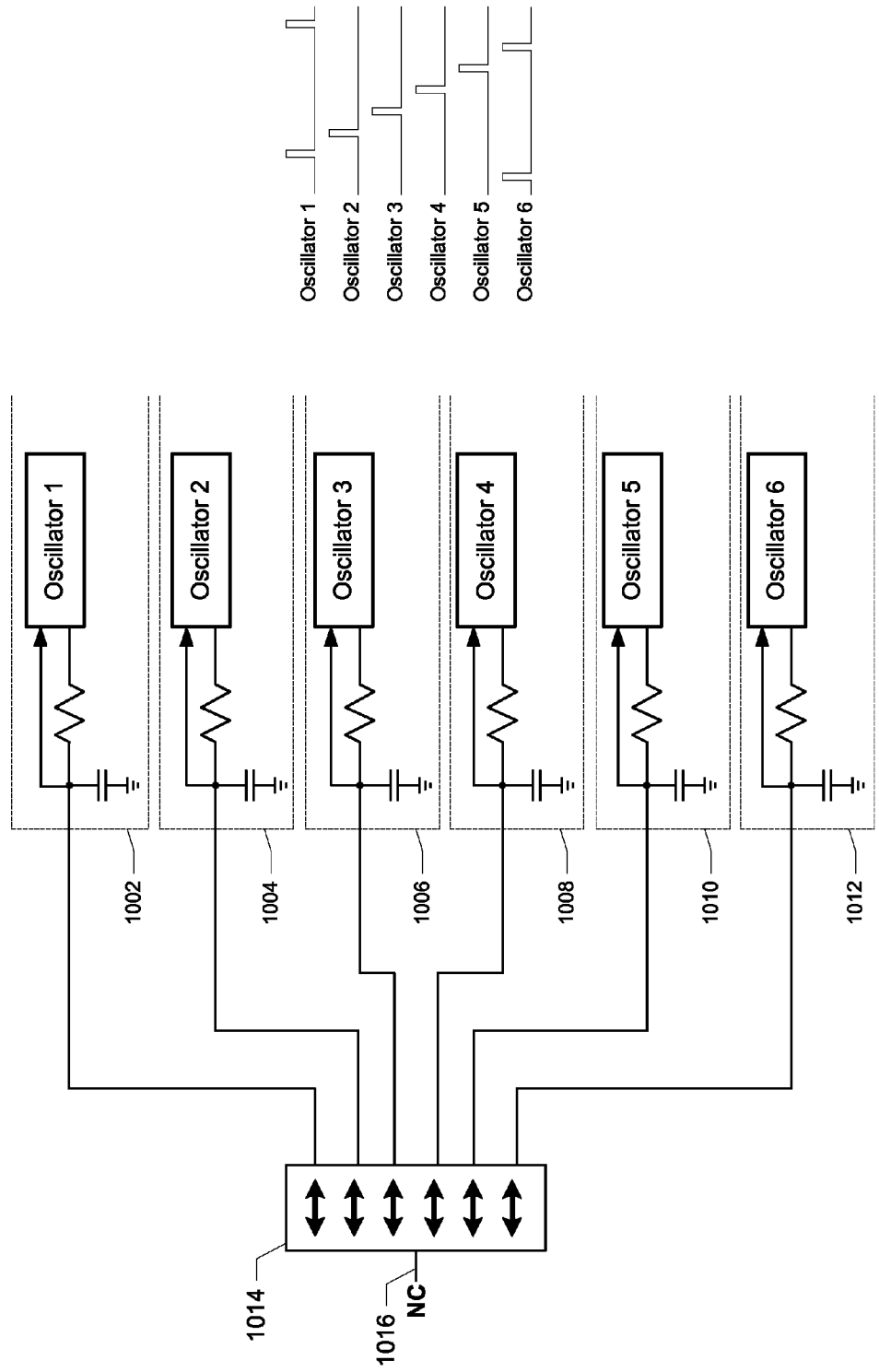
FIG. 11 is a simplified block diagram of a portion of the DC to DC converter of FIG. 10.

According to a particular implementation, FRM 1014 receives as input a waveform from each of the parallel phases representing the frequency of operation of the respective phase. This results in an output waveform at the common node 1016 of the FRM at 6 times the frequency of any of the inputs. As shown in FIG. 11, these inputs to the FRM may be derived, for example, from an oscillator in each phase's control circuitry that generates the pulse for turning on that phase's high-side switch. Other suitable sources for a waveform having such information will be apparent to those of skill in the art and may vary depending on the implementation.

In the implementation shown in FIG. 11, the pulse waveform from the oscillator is filtered with a low pass filter to generate a waveform at the FRM input. The connection of the FRM works to substantially average the signals, the results of which are then also fed back to the oscillator which uses the feedback to control its output frequency to oppose the average of the other inputs to the FRM (included in the average at common node 1016) and to bring the voltage on the common node close to zero. That is, each phase provides a ripple contribution at the common node and adjusts its relative delay to minimize the amplitude of the signal on the common node. When the common node signal is minimized the operation of the phases is distributed substantially evenly over 360 degrees of phase.

If one of the phases fails, the input to FRM 1014 from that phase is isolated, and the averaging function performed by FRM 1014 acts on the remaining phases to readjust the frequencies of their respective oscillators to redistribute the operation of the remaining five phases substantially evenly around the 360 degrees of phase.

Implementations are contemplated in which FRM 1014 is replaced with an averaging circuit that may or may not be fault tolerant. That is, if fault tolerance is not an important design factor, the frequency synchronization described above with reference to FIGS. 10 and 11 may be achieved without an FRM as described herein. The scope of claims relating to frequency synchronization of parallel phases of a multi-phase DC to DC converter should therefore not necessarily be limited in this respect.

Figure 12:
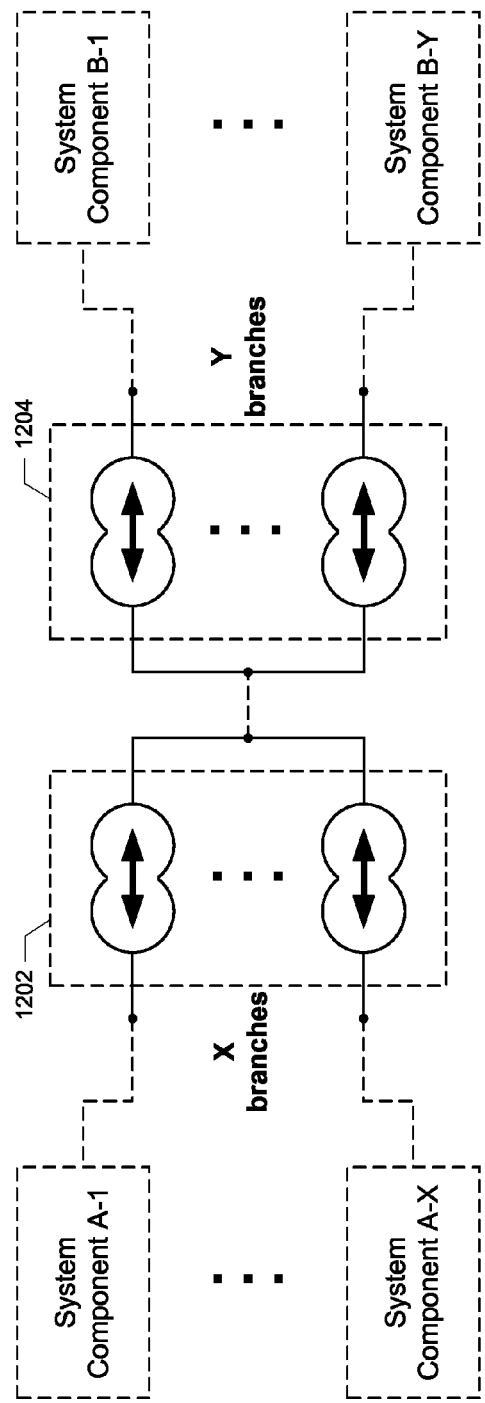
FIG. 12 is a circuit diagram of two FRMs implemented back to back.

Because FRMs are constructed from bidirectional components, it should be noted that the terms "input" and "output" may not be consistently applied to FRM terminals over different applications, i.e., an input in one application may be an output in another. The use of "terminal" or "node" may therefore be more suitable as a generic characterization. FIG. 12 is illustrative of this. The left hand side of the diagram shows X system components (e.g., system components A-1 through A-X) providing inputs to the X branches of a first FRM 1202. The right hand side of the diagram shows Y system components (e.g., system components B-1 through B-Y) receiving inputs from the Y branches of a second FRM 1204. Either configuration may be used to isolate the respective system components for any of a variety of purposes, e.g., redundancy, fault tolerance, load sharing, etc.

According to a particular class of implementations, FRMs 1202 and 1204 may be cascaded back to back (i.e., the common nodes of the FRMs are connected as indicated by the dashed line) to receive inputs from the X branches and provide outputs to the Y branches while providing fault isolation from any of the X or Y branches to every other one of the branches. Such a configuration of FRMs may be used, for example, to facilitate information sharing in any kind of redundant system while significantly reducing the likelihood of the introduction of a SPOF. That is, the outputs of X redundant system components may be received as inputs to such a configuration of FRMs and then fed to Y system components while maintaining sufficiently autonomous operation of system components to support fault-tolerant system level operation.

Figure 13:
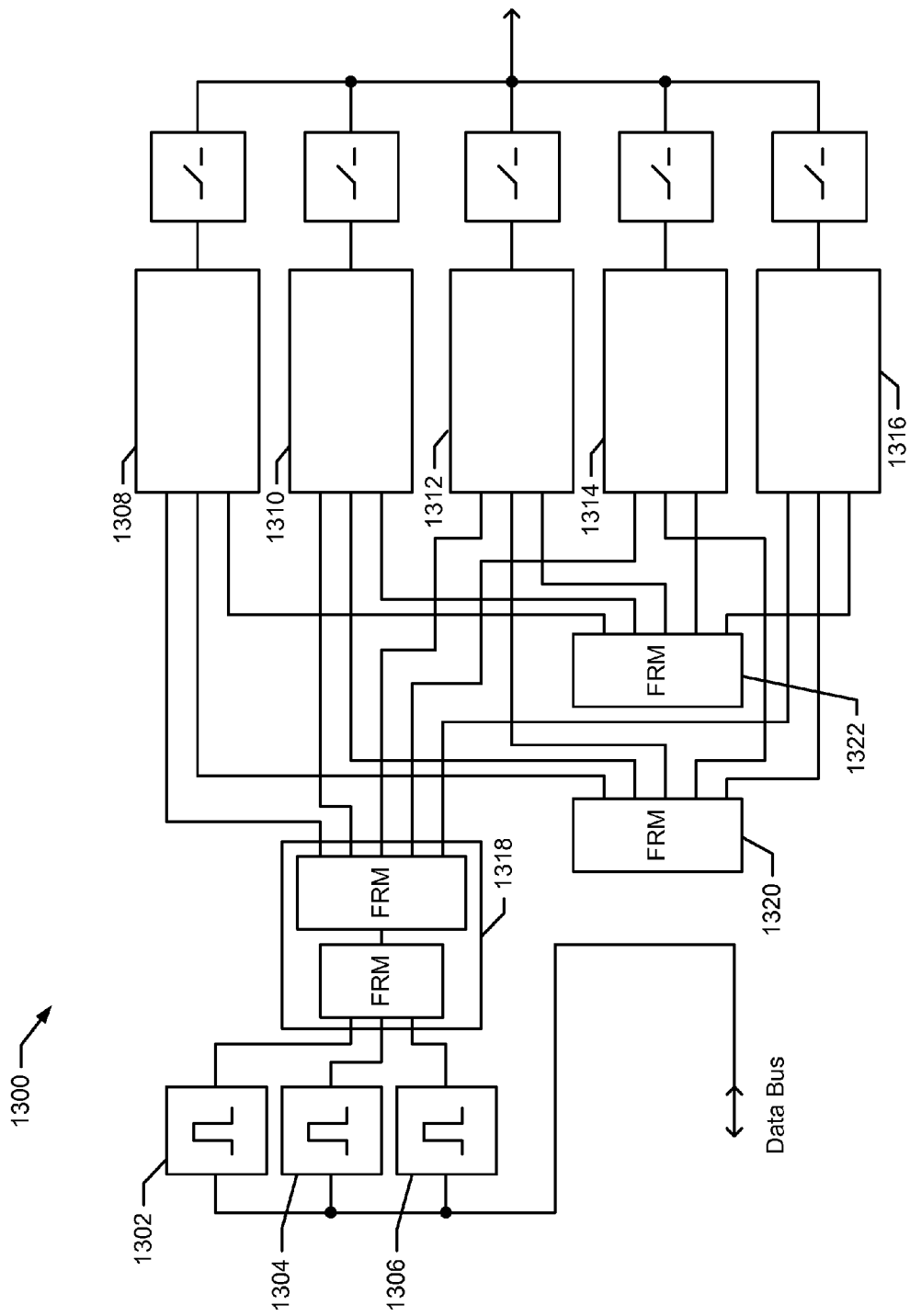
FIG. 13 is a simplified block diagram of a DC to DC converter employing multiple FRMs.

FIG. 13 illustrates a multi-phase DC to DC converter 1300 in which FRMs are employed to achieve fault tolerance among redundant components as well as some level of coordination among system components in multiple respects. Application-specific redundant data communication blocks 1302-1306 drive multiple parallel phases 1308-1316 via a back to back FRM configuration 1318, effectively isolating a failure in any one of the data communication blocks and power stages from any of the others. According to some implementations, each of phases 1308-1316 may include one or more additional parallel phases. For example, each of these parallel phases may include two parallel phases, operation of which is more tightly coupled than the operation of phases 1308-1316.

One advantage of such an approach would be that it could reduce the need to achieve frequency synchronization among phases 1308-1316. That is, as discussed above, frequency synchronization among parallel phases can be advantageous with regard to reducing ripple current. However, in many applications much of the improvement in ripple current can be achieved with relatively few parallel phases, with each additional parallel phase introducing only incremental improvement. If each of phases 1308-1316 included two parallel phases, ripple cancellation could be achieved within each of phases 1308-1316 (using any of a wide variety of techniques) to a degree that may be sufficient to dispense with implementing a ripple cancellation scheme at the system level, i.e., among phases 1308-1316.

Multi-phase DC to DC converters may also include FRMs 1320 and 1322 which receive inputs from the parallel phases to effect coordination among the operation of the phases while maintaining isolation among the phases. FRMs 1320 and 1322 may be used to implement a wide variety of inter-phase communication and optimization loops including, for example, current sharing, frequency synchronization, or any other system functionality that requires the sharing of information among the parallel phases. Variations of the general architecture illustrated will be understood by those of skill in the art.

While the invention has been particularly shown and described with reference to specific embodiments thereof, it will be understood by those skilled in the art that changes in the form and details of the disclosed embodiments may be made without departing from the spirit or scope of the invention. For example, as discussed above, despite references to the use of FRMs in various types of DC to DC converters, FRMs described herein may be used to support redundancy and/or fault tolerance and/or the sharing of information among independent system components in a wide variety of systems. The scope of the invention should therefore not be limited with reference to specific applications of the FRM described herein. Neither should at least some of the DC to DC converters described herein be limited to implementation using FRMs. That is, for example, functionalities such as current sharing and frequency synchronization may be implemented in multi-phase DC to DC converters without requiring use of an FRM.

In another example, implementations of an FRM that are within the scope of the present invention are not limited to the specific implementations of bidirectional isolators described herein. For example, the implementations of FIGS. 1-4 show various specific configurations of transistors. However, it should be appreciated that implementations are contemplated in which 2, 3, 4, or even more transistors may be configured in series and various other suitable configurations that achieve the described behavior.

It will also be understood that the systems, components, devices and functionalities described herein may be implemented in a wide variety of contexts using a wide variety of technologies without departing from the scope of the invention. That is, embodiments of the invention may be implemented in processes and circuits which, in turn, may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS), and device types (e.g., MOSFETs or JFETs) suitable for designing and manufacturing the circuits described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A mixer, comprising a plurality of bidirectional isolators, each bidirectional isolator having a first terminal and a second terminal, the first terminals of all of the bidirectional isolators being coupled to a common node of the mixer, the second terminal of each of the bidirectional isolators being configured to transmit a corresponding system signal to or from a system environment in which the mixer is included, the bidirectional isolators being configured such that a mixer signal at the common node substantially corresponds to a combination including a contribution from each of the system signals within a valid input range of the corresponding bidirectional isolator, the bidirectional isolators being further configured such that contribution to the mixer signal from each of the system signals outside of the corresponding valid input range is substantially rejected.

2. The mixer of claim 1 wherein the combination of the system signals within the corresponding valid input ranges substantially corresponds to one of (1) an average of the system signals within the corresponding valid input ranges, (2) a scaled average of the system signals within the corresponding valid input ranges, or (3) an average of the system signals within the corresponding valid input ranges with an added offset.

3. The mixer of claim 1 wherein each of the bidirectional isolators is further configured such that operation of the mixer does not require a bias voltage from the system environment.

4. The mixer of claim 1 wherein each of the bidirectional isolators is configured to generate a substantially constant positive current or a substantially constant negative current when the corresponding system signal is outside of the valid input range of the bidirectional isolator.

5. The mixer of claim 1 wherein each of the bidirectional isolators is configured to appear as a substantially open circuit when the corresponding system signal is outside of the valid input range of the bidirectional isolator.

6. The mixer of claim 1 wherein each of the bidirectional isolators is configured to generate substantially no current when the corresponding system signal is outside of the valid input range of the bidirectional isolator.

7. The mixer of claim 1 wherein each of the bidirectional isolators includes two n-channel depletion-mode transistors with source terminals connected.

8. The mixer of claim 7 wherein each of the bidirectional isolators further comprises two p-channel transistors, each p-channel transistor being connected in series with a drain terminal of one of the n-channel depletion-mode transistors.

9. The mixer of claim 1 wherein each of the bidirectional isolators includes a plurality of transistors coupled in series.

10. A circuit configured to connect X system components to Y system components in a system environment, and to substantially isolate each of the X and Y system components from faults associated with any other of the X and Y system components, wherein X and Y are both integers greater than one, the circuit comprising:

a first mixer comprising a first plurality of bidirectional isolators, each of the first plurality of bidirectional isolators having a first terminal and a second terminal, the first terminals of all of the first plurality of bidirectional isolators being coupled to a common node, the second terminal of each of the first plurality of bidirectional isolators being configured to transmit a corresponding system signal to or from a corresponding one of the X system components, the first plurality of bidirectional isolators being configured such that a mixer signal at the common node includes a combination including a contribution from each of the system signals corresponding to the X system components within a first valid input range of the corresponding bidirectional isolator of the first plurality of bidirectional isolators, the first plurality of bidirectional isolators being further configured such that contribution to the mixer signal from any of the system signals corresponding to the X system components outside of the corresponding first valid input range is substantially rejected; and a second mixer comprising a second plurality of bidirectional isolators, each of the second plurality of bidirectional isolators having a first terminal and a second terminal, the first terminals of all of the second plurality of bidirectional isolators being coupled to the common node, the second terminal of each of the second plurality of bidirectional isolators being configured to transmit a corresponding system signal to or from a corresponding one of the Y system components, the second plurality of bidirectional isolators being configured such that the mixer signal also includes a combination including a contribution from each of the system signals corresponding to the Y system components within a second valid input range of the corresponding bidirectional isolator of the second plurality of bidirectional isolators, the second plurality of bidirectional isolators being further configured such that contribution to the mixer signal from any of the system signals corresponding to the Y system components outside of the corresponding second valid input range is substantially rejected.

11. The circuit of claim 10 wherein:

the combination of all of the system signals corresponding to the X system components within the corresponding first valid input ranges substantially corresponds to one of (1) an average of the system signals corresponding to the X system components within the corresponding first valid input ranges, (2) a scaled average of the system signals corresponding to the X system components within the corresponding first valid input ranges, or (3) an average of the system signals corresponding to the X system components within the corresponding first valid input ranges with an added offset; and the combination of all of the system signals corresponding to the Y system components within the corresponding second valid input ranges substantially corresponds to one of (1) an average of the system signals corresponding to the Y system components within the corresponding second valid input ranges, (2) a scaled average of the system signals corresponding to the Y system components within the corresponding second valid input ranges, or (3) an average of the system signals corresponding to the Y system components within the corresponding second valid input ranges with an added offset.

12. The circuit of claim 10 wherein each of the bidirectional isolators is further configured such that operation of the first and second mixers does not require a bias voltage from the system environment.

13. The circuit of claim 10 wherein each of the bidirectional isolators is configured to appear as a substantially open circuit when the corresponding system signal is outside of the valid input range of the bidirectional isolator.

14. The circuit of claim 10 wherein each of the bidirectional isolators is configured to generate a substantially constant positive current or a substantially constant negative current when the corresponding system signal is outside of the valid input range of the bidirectional isolator.

15. The circuit of claim 10 wherein each of the bidirectional isolators is configured to generate substantially no current when the corresponding system signal is outside of the valid input range of the bidirectional isolator.

16. The circuit of claim 10 wherein each of the bidirectional isolators includes two n-channel depletion-mode transistors with source terminals connected.

17. The circuit of claim 16 wherein each of the bidirectional isolators further comprises two p-channel transistors, each p-channel transistor being connected in series with a drain terminal of one of the n-channel depletion-mode transistors.

18. The circuit of claim 10 wherein each of the bidirectional isolators includes a plurality of transistors coupled in series.

19. A system, comprising:
X system components, wherein X is an integer greater than one; and
a first mixer comprising a first plurality of bidirectional isolators, each of the first plurality of bidirectional isolators having a first terminal and a second terminal, the first terminals of all of the first plurality of bidirectional isolators being coupled to a first common node, the second terminal of each of the first plurality of bidirectional isolators being configured to transmit a corresponding system signal to or from a corresponding one of the X system components, the first plurality of bidirectional isolators being configured such that a first mixer signal at the first common node substantially corresponds to a combination including a contribution from each of the system signals corresponding to the X system components within a first valid input range of the corresponding bidirectional isolator of the first plurality of bidirectional isolators, the first plurality of bidirectional isolators being further configured such that contribution to the first mixer signal from any of the system signals corresponding to the X system components outside of the corresponding first valid input range is substantially rejected.

20. The system of claim 19 wherein the first plurality of bidirectional isolators are configured such that operation of the first mixer does not require a bias voltage from the system.

21. The system of claim 19 wherein the combination of the system signals within the corresponding first valid input ranges substantially corresponds to one of (1) an average of the system signals within the corresponding first valid input ranges, (2) a scaled average of the system signals within the corresponding first valid input ranges, or (3) an average of the system signals within the corresponding first valid input ranges with an added offset.

22. The system of claim 19 further comprising:
Y system components, wherein Y is an integer greater than one; and
a second mixer comprising a second plurality of bidirectional isolators, each of the second plurality of bidirectional isolators having a first terminal and a second terminal, the first terminals of all of the second plurality of bidirectional isolators being coupled to a second common node, the second terminal of each of the second plurality of bidirectional isolators being configured to transmit a corresponding system signal to or from a corresponding one of the Y system components, the second plurality of bidirectional isolators being configured such that second mixer signal at the second common node substantially corresponds to a combination of all including a contribution from each of the system signals corresponding to the Y system components within a second valid input range of the corresponding bidirectional isolator of the second plurality of bidirectional isolators, the second plurality of bidirectional isolators being further configured such that contribution to the second mixer signal from any of the system signals corresponding to the Y system components outside of the corresponding second valid input range is substantially rejected.

23. The system of claim 22 wherein the second plurality of bidirectional isolators are configured such that operation of the second mixer does not require a bias voltage from the system.

24. The system of claim 22 wherein the first common node is the second common node, and the first mixer signal is the second mixer signal.

* * * * *